US005206464A

United States Patent [19]

Lamm et al.

[11] Patent Number: 5,206,464

[45] Date of Patent: Apr. 27, 1993

[54] LOUDSPEAKER MOUNTING ASSEMBLY

[75] Inventors: Michael E. Lamm, High Ridge, Mo.; S. Richard Hrach, Jr., Ellisville, Ill.

[73] Assignee: American Trading and Production Corporation, Baltimore, Md.

[21] Appl. No.: 702,276

[22] Filed: May 17, 1991

[51] Int. Cl.[5] .............................................. H05K 5/00

[52] U.S. Cl. .................................... 181/150; 181/151; 181/153; 181/199

[58] Field of Search ............... 181/141, 148, 149, 150, 181/151, 153, 199

[56] References Cited

U.S. PATENT DOCUMENTS 2,949,163 8/1960 Friedman ............................ 181/199

3,985,200 10/1976 Sepmeyer ........................... 181/150

*Primary Examiner*—Donald A. Griffin

*Assistant Examiner*—Khanh Dang

*Attorney, Agent, or Firm*—Cohn, Powell & Hind

[57] ABSTRACT

This mounting assembly (10) for a loudspeaker (30), or similar fixture, includes an enclosure (12) for mounting the loudspeaker (30) to a ceiling (C) or the like. The enclosure (12) includes a wall attached portion (16) having an interior annular flange (20) and an exterior annular flange (22) connected by a peripheral sidewall (24). The loudspeaker flange (32) is attached to the interior flange (20) by removable fasteners (36) and the enclosure is attached to the ceiling by fasteners (40). A baffle (60) is removably attached to the enclosure exterior flange (22) by fixed fasteners (62). The enclosure (12), in one embodiment, includes a fixedly attached closed portion (14) and the enclosure portions are attached to a ceiling (C) by swivel clamping members (50).

17 Claims, 3 Drawing Sheets

FIG. 6
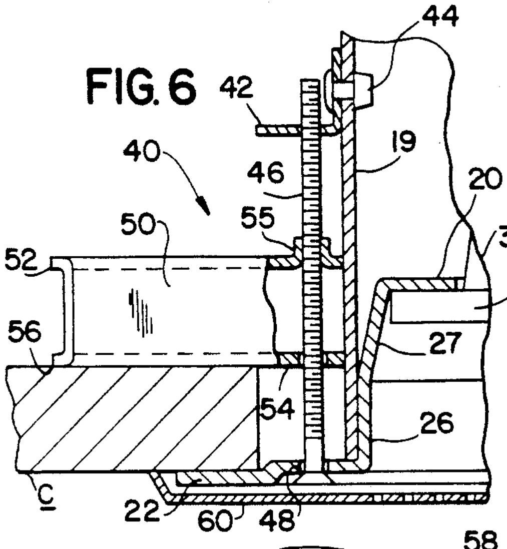
FIG. 7
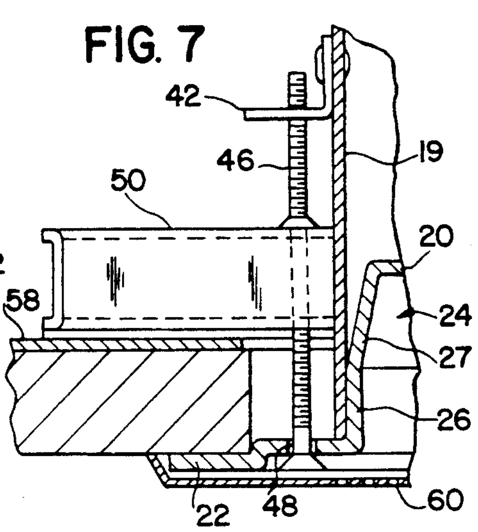
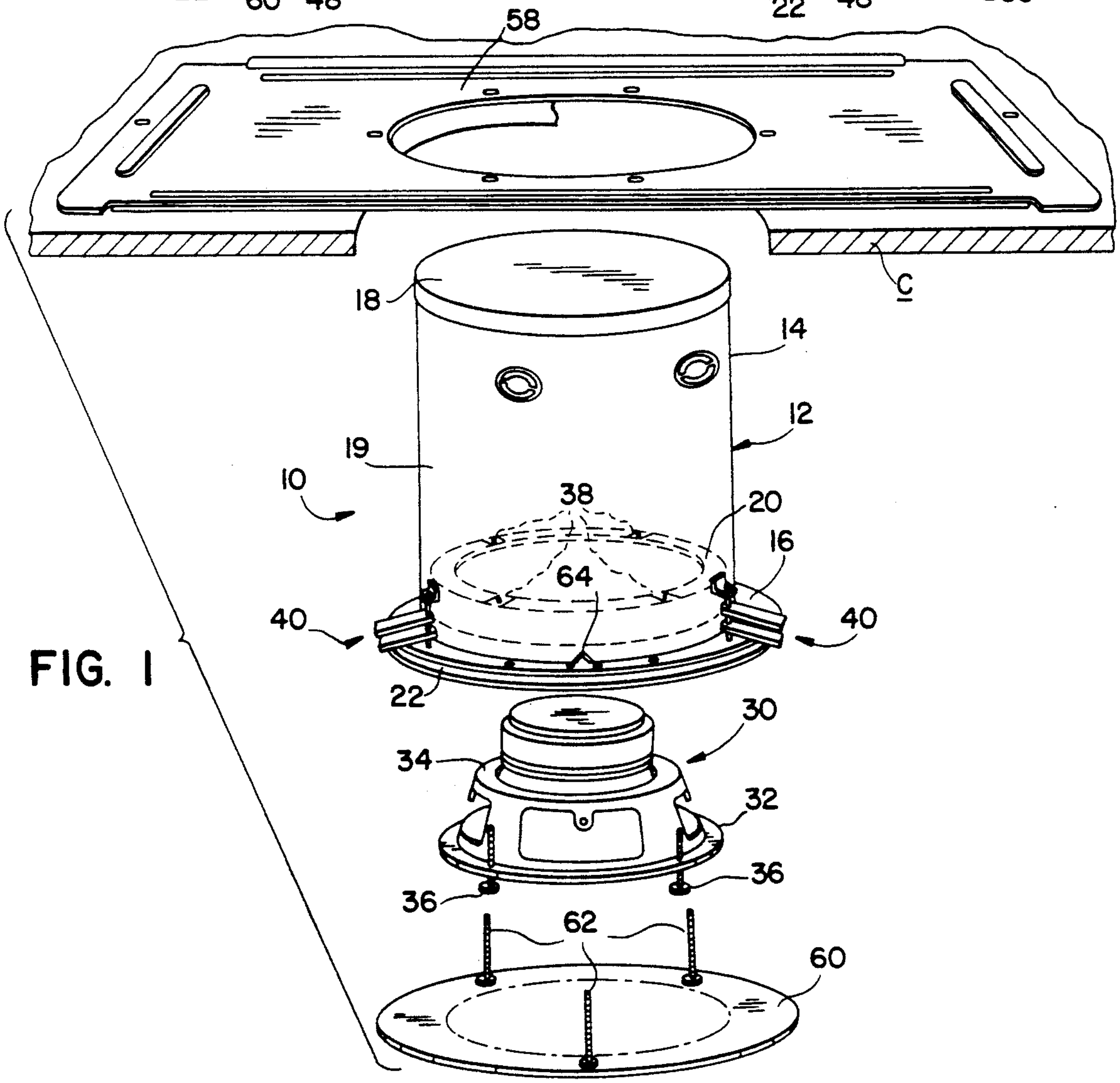
FIG. 1

LOUDSPEAKER MOUNTING ASSEMBLY

BACKGROUND OF THE INVENTION

This invention relates generally to recessed fixture mounting assemblies and particularly to an assembly for a loudspeaker in which the weight of the loudspeaker is carried by the loudspeaker enclosure.

One of the most common systems for mounting loudspeakers to a ceiling or other wall surface is simply to attach the loudspeaker to a baffle as by bolts and then mount the baffle and loudspeaker combination directly to the surface by bolting the baffle to the ceiling by the use of toggle bolts. This system is unsatisfactory because it requires relatively large toggle bolt openings close to the margin of the loudspeaker-receiving opening. In addition, the combined weight of the loudspeaker and baffle is carried directly by the ceiling. Moreover, the weight of the combined loudspeaker and baffle is considerable making installation and handling difficult.

An improved loudspeaker support system for a suspended ceiling is disclosed incommonly owned U.S. Pat. No. 4,484,658 in which the weight of the baffle is carried by the ceiling through brackets attached to the baffle and carried by rods extending between the suspended T-members. This arrangement avoids load transfer directly to the ceiling panel but the weight of the speaker is carried by the baffle and it is attached to the baffle.

Another improvement in loudspeaker mounting systems is shown and described in commonly owned U.S. Pat. No. 4,673,149. In this system an enclosure is mounted to the ceiling and the loudspeaker is mounted to the outside of the enclosure. While avoiding the problem of direct ceiling mounting by toggle bolts, the weight of the loudspeaker in this type of arrangement is still carried by the baffle prior to installation.

The present invention solves these and other problems in a manner not disclosed in the known prior art.

SUMMARY OF THE INVENTION

This loudspeaker mounting assembly has the particular advantage that the weight of the fixture for example a loudspeaker is carried by a ceiling or wall mounted enclosure directly, rather than by means of a baffle, so that the loudspeaker can readily be frontloaded.

Another advantage is that the speaker baffle is readily attachable and detachable without the use of tools and yet does not have visible mounting hardware, thereby presenting a more aesthetic and neater appearance. A backbox enclosure is provided which has the advantage of being easily mounted without the use of special tools and is adapted to allow the interchange of components mounted to the enclosure.

It is an aspect of this invention to provide a loudspeaker mounting assembly having an enclosure portion including an outer exterior flange and an inner interior flange and a peripheral sidewall connecting said exterior and interior flanges, the inner interior flange being spaced from said outer exterior flange; attachment means removably attaching the loudspeaker flange to the enclosure portion interior flange; attachment means attaching the enclosure portion exterior flange to a wall or ceiling surface, and a baffle disposed outwardly of the surface including means removably attaching said baffle to said enclosure portion exterior flange.

It is another aspect of this invention to provide an enclosure having a first enclosure portion including an upper endwall and a peripheral sidewall and a remote end; a second enclosure portion including an interior flange disposed in spaced relation from said first enclosure portion remote end inwardly of the peripheral sidewall; first attachment means attaching the second enclosure portion to the first enclosure portion; second attachment means attaching the loudspeaker flange to the interior flange, and third attachment means operatively attaching the first and second enclosure portions to the ceiling.

It is yet another aspect of this invention to provide that the second enclosure portion includes an exterior flange and a peripheral sidewall interconnecting said exterior flange to said interior flange.

Still another aspect is to provide that said peripheral sidewall includes an upper conical portion to facilitate interfitting said second enclosure portion into said first enclosure portion, and another aspect of this invention is to provide that said peripheral sidewall of said second enclosure portion includes a lower portion sized for a close fit within said peripheral sidewall of said first enclosure portion and said first attachment means includes a plurality of circumferentially disposed spot welds between said interfitting sidewall portions.

Yet another aspect of this invention is to provide that said loudspeaker flange and said interior flange are operatively interconnected by threaded fasteners to facilitate direct front-loading of the loudspeaker.

It is an aspect of this invention to provide that said third attachment means each includes an apertured member fixedly attached to said first enclosure portion peripheral sidewall, a threaded fastener received by said exterior flange and a clamping member adapted for vertical movement on said threaded fastener to clamp said enclosure first and second portions to said ceiling.

It is yet another aspect of this invention to provide that said baffle attachment means includes a plurality of serrated studs fixedly attached to said baffle and a plurality of cooperating clips fixedly attached to said second enclosure portion exterior flange.

Another aspect of this invention is to provide that said assembly includes an apertured frame carried by and reinforcing said ceiling and received said enclosure therethrough and said clamping members engage said frame.

It is an aspect of this invention to provide a loudspeaker mounting assembly which is relatively inexpensive and simple to manufacture and can be easily installed without special tools.

BRIEF DESCRIPTION OF THE DRAWINGS

FIG. 1 is an exploded, perspective view of the loudspeaker, enclosure and mounting assembly.

FIG. 6 is a cross sectional view of a swivel fastener used with a ceiling tile.

FIG. 7 is a cross sectional view of a swivel fastener used with a plaster ceiling.

DESCRIPTION OF THE PREFERRED EMBODIMENT

Figure 2:
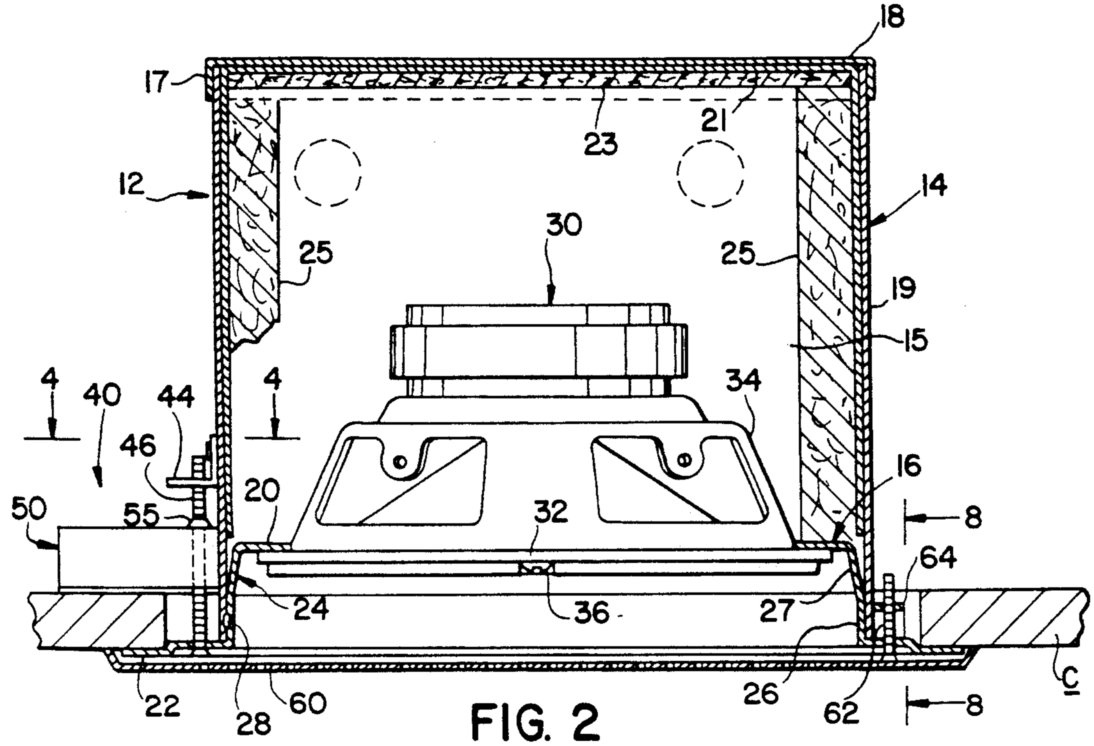
FIG. 2 is a cross sectional view through the loudspeaker mounting assembly.
Figure 3:
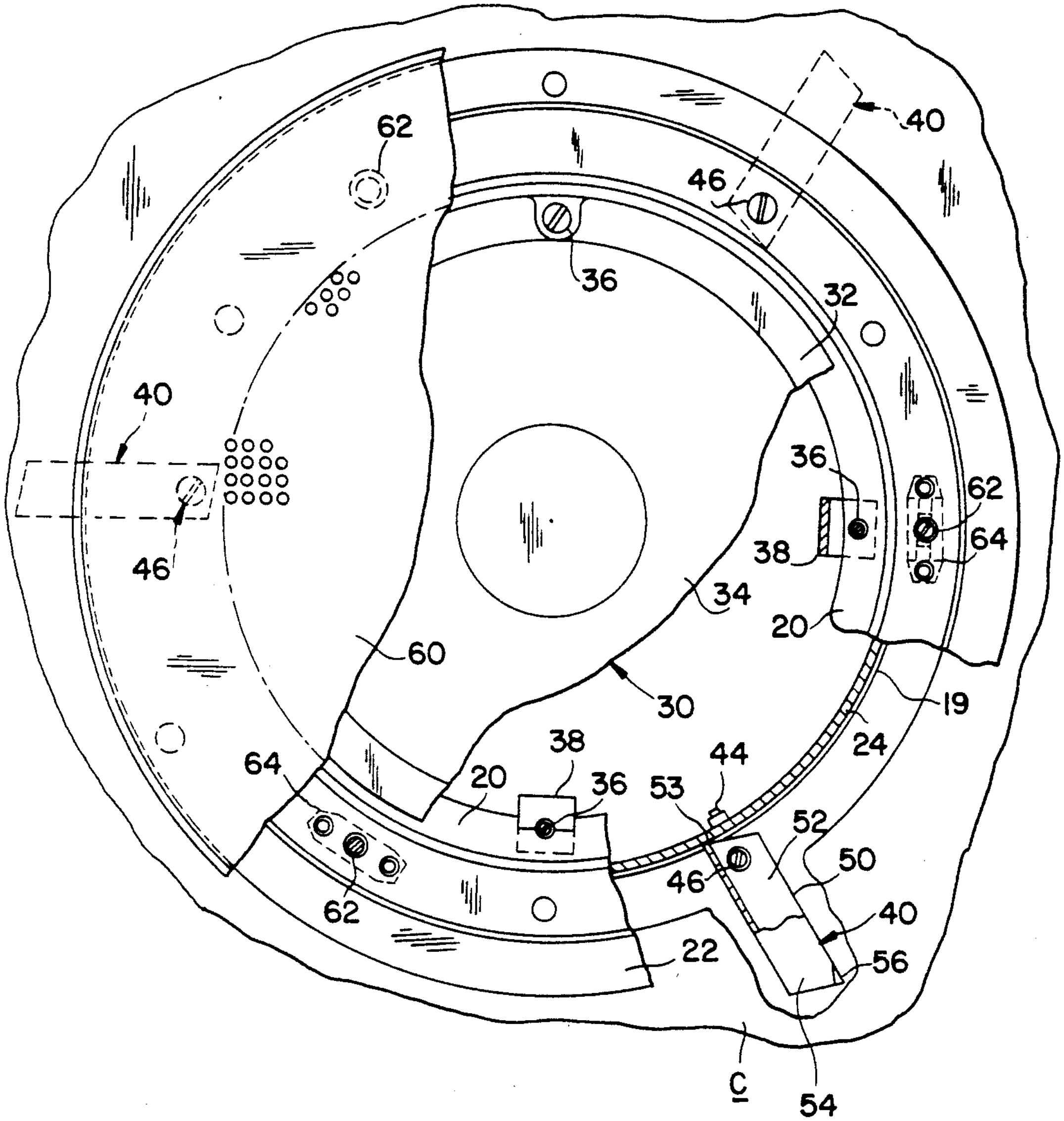
FIG. 3 is a fragmentary plan view of the underside of the assembly.

Referring now by reference numerals to the drawings and first to FIGS. 1, 2 and 3 it will be understood that the mounting assembly 10 for a loudspeaker, or the like, includes an enclosure 12 having a first upper portion 14 and a second, lower portion 16. The first portion 14 includes an endwall 18 and a peripheral sidewall 19 and provides a backbox. The second portion 16 is attached to the first portion at the lower, remote end of the sidewall 16 and provides a trim ring. The second portion 16, in the embodiment shown, is Z-shaped in cross section to define an interior flange 20; a stepped exterior flange 22, and an interconnecting web or sidewall 24. The interconnecting sidewall 24 includes a lower portion 26 which is diametrically sized to closely interfit the peripheral sidewall 19 and an upper portion 27 which is frusto-conical in configuration to facilitate interfitting the second enclosure portion 16 within the first enclosure portion 14. The attachment between the enclosure portions is effectuated in the embodiment shown by peripherally spaced spot welds 28, constituting a first attachment means, and best shown in FIG. 2.

The loudspeaker 30 is conventional in that it is provided with a flange 32 by which it is unconventionally attached to the interior flange 20 so that the upstanding, generally frusto-conical basket portion 34 projects through the opening defined by the interior flange 20. As best shown in FIGS. 1 and 3 the loudspeaker attachment means, constituting a second attachment means, includes a plurality of threaded fasteners 36 and cooperating clips 38 fixedly attached to the interior flange 20.

The enclosure 12 is attached to the ceiling C by a plurality of attachment means, generally indicated by numeral 40 and constituting a third attachment means, as will now be described with reference to FIGS. 3–7.

Figure 4:
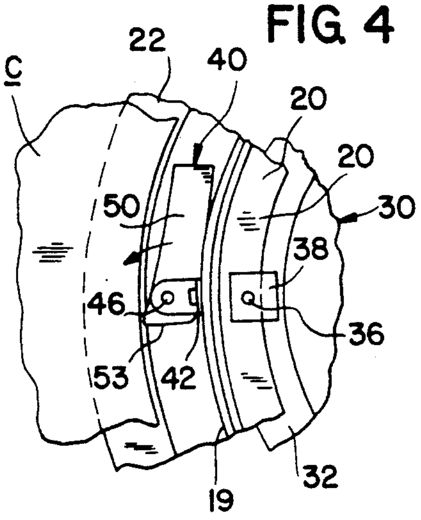
FIG. 4 is an enlarged sectional detail taken on line 4—4 of FIG. 2.
Figure 5:
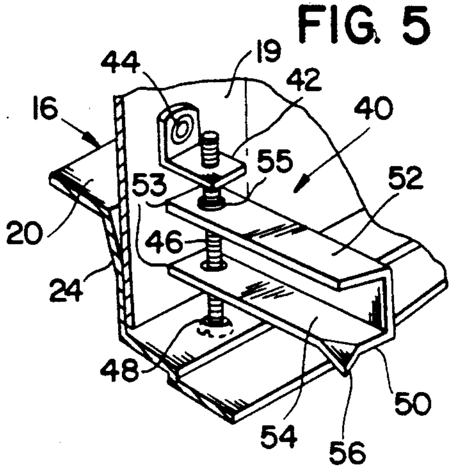
FIG. 5 is an enlarged fragmentary perspective view of a swivel fastener.

Each attachment means 40, as best shown in FIGS. 3–5, includes an apertured L-shaped member 42 fixedly attached to the enclosure sidewall 19 as by rivets 44; an elongate screw 46 received within an unthreaded opening 48 provided in the exterior flange 22 of the enclosure portion 16, and a C-shaped clamping member 50. The clamping members 50, when disposed alongside the sidewall 19 is sufficiently clear of the ceiling overside hole to permit insertion of the enclosure, while the exterior flange 22 is larger than said oversize hole. The clamping member 50 has apertured upper and lower flanges 52 and 54 and the upper flange opening 55 receives the screw 46 in threaded relation so that as the screw 46 is rotated, the clamping member 50 moves vertically relative to said screw. This vertical movement is facilitated by engagement of the slanted inner end 53 of clamping member 50 with the enclosure wall 19, following initial rotation with the screw 46, which prevents further swiveling of the clamping member 50 as the screw 46 is rotated once the wall 19 is engaged. The lower flange 54 of clamping member 50 is downturned to provide a point 56 which tends to dig into the upper face of the ceiling C as shown in FIG. 6.

In some instances, for example when the ceiling is formed from suspended tile, it is desirable, as shown in FIGS. 1 and 7, to provide a metal stiffening frame 58. The frame is apertured to receive the enclosure 12 and is of a length to provide a bridge supported by the suspended tile T-support (not shown). As shown in FIG. 7, when a frame 58 is used the clamping member 50 engages the frame rather than the tile. The arrangement is otherwise substantially identical with that shown in FIG. 6.

Figure 8:
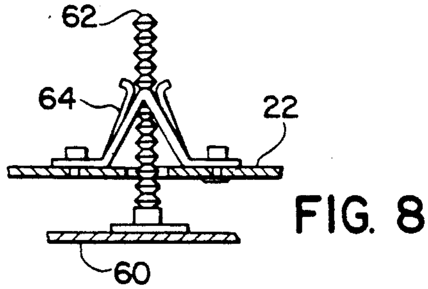
FIG. 8 is an enlarged sectional detail taken on the 8—8 of FIG. 1.

The loudspeaker assembly in the embodiment shown includes a baffle 60. This baffle is attached to the enclosure second portion exterior flange by means of a plurality of circumferentially arranged studs 62, three in number in the embodiment shown. The studs are disposed at equal intervals on said baffle and attached to said baffle by spot welding such that they are not visible on the viewed face of the baffle. As best shown in FIG. 8 the studs 62 are serrated and cooperate with clips 64 attached, as by rivets, to the exterior flange 22. This arrangement provides that the baffle 60 can easily be pushed into place after the enclosure 12 has been attached to the ceiling C and the loudspeaker 30 been attached to the enclosure.

Figure 9:
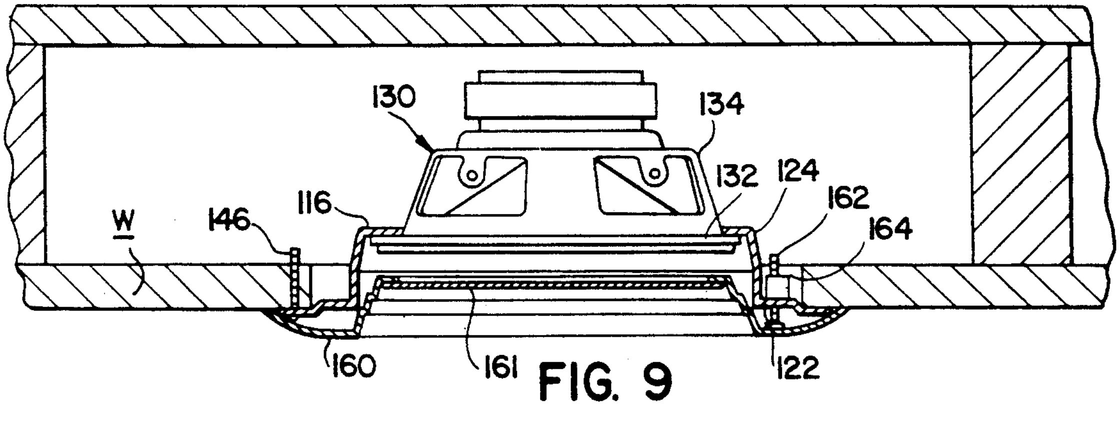
FIG. 9 is a similar view to FIG. 2 showing a horizontal section through a modified construction for use with a vertical wall.

FIG. 9 shows a modified loudspeaker assembly which is used when the loudspeaker is to be installed in a vertical partition wall W. For convenience, similar parts are given the same reference numeral with the addition of a prefix numeral 1.

In this arrangement there is no portion corresponding to the upper enclosure portion but only an outer enclosure portion 116 corresponding to the lower enclosure portion 16 in the embodiment discussed above. This outer enclosure portion 116 includes an interior flange 120 and a stepped exterior flange 122 and a connecting sidewall 124. The exterior flange 122 is attached directly to the wallboard, which is provided with an oversize opening, by means of screws 146 which constitute an attachment means. The loudspeaker 30 is attached to the interior flange 120 by screws and clips as previously discussed but not shown in FIG. 9.

The baffle 160 is different from that described in the previous embodiment in that it includes a recessed center grill portion 161 but is substantially identical in that it includes a plurality of welded studs 162 which cooperate with the threaded clips 164 fixedly attached to the exterior flange 122 of the enclosure portion 116.

It is thought that the structural arrangement of parts and functional features be readily understood from the foregoing description of parts However, for completeness of disclosure, the installation of the assembly will be briefly described with reference to the first embodiment of FIGS. 1–8.

The enclosure 12 is formed into an integral unit by pushing the lower portion 14 into the upper portion 16 and attaching the two portions together by intermittent spot welds 28. The L-shaped members 44 of the ceiling attachment clamping members 50 and the baffle attachment clips 64 are riveted in place. The clamping members 50 are emplaced by screws 46 which are initially rotated to the position, shown in FIG. 4, so that they are alongside the enclosure sidewall 19. The enclosure 12 can then be pushed into place inside the recess provided by the preformed ceiling opening which is approximately the same size as to comfortably fit the stepped portion of the exterior flange 22 with the exterior flange 122 engaging the wall. When the screws 46 are rotated the clamping members 50 rotate with them until the slanted end of said members engage the sidewall 19 as shown in FIG. 3. At this point no further swiveling of the clamping member is possible and continued rotation of the screw 46 causes said member to move vertically into engagement with the upper face of the ceiling C or the frame 58 if a frame is used. When the enclosure 12 is thus clamped between the clamping members 50 and the exterior flange 22, the loudspeaker clips 38 can be emplaced on the interior loudspeaker mounting flange 20. It is then a simple matter to front load the loudspeaker 30 into place and attach it to the flange 20 by screws 36. With the loudspeaker thus installed it is also a simple matter to align the serrated baffle studs 62 with the retainer clips 64 and push the baffle into place to achieve the completed installation shown in FIG. 2. To the observer the baffle has no visible hardware and thereby presents a neater and more aesthetic appearance. Importantly, the weight of the loudspeaker is not carried by the baffle 60.

In order to replace the loudspeaker 30, for example with a higher quality unit, it is simply a matter of pulling the baffle 60 clear without the need for tools. The loudspeaker connection screws 36 can then be readily removed with a screw driver and the replacement readily achieved by reversing the process.

In the embodiment shown in FIG. 2 the enclosure upper lapped, portion 14 is formed from sidewall or wrap 19 having an intermittently spot welded longitudinal seam 15 and the and the endwall 18 is formed from a fitted, intermittently spot welded end cap 17. The enclosure end wall 18 and the sidewall 19 are coated with pliable mastic coating 21 to seal seams and deaden resonance. The endwall 18 is additionally provided with soundboard 23 of about ⅜ inch to ½ inch thickness to reduce diaphragmatic movement and the sidewall 18 is additionally lined with a material such as Tufflex (an acoustic wrap) of about 1 inch thick indicated by numeral 25, to absorb standing waves. Because of the structural arrangement of parts, the interior flange 20 and therefore the loudspeaker 30, can be precisely located within the enclosure 12 with the result that the positioning of the loudspeaker within a backbox volume is automatically obtained to provide optimum sound quality. For example, with a six-inch speaker the volume above the interior flange is between 175-300 cubic inches.

In view of the above it will be seen that various aspects and features of the invention are achieved and other advantageous results attained. While preferred embodiments of the invention have been shown and described, it will be obvious to those skilled in the art that changes and modifications may be made therein without departing from the invention in its broader aspects.

We claim as our invention:

1. A loudspeaker mounting assembly for a loudspeaker having a mounting flange, the assembly being adapted to recess mount the loudspeaker to a ceiling having an upper side and a lower side, the assembly comprising:

(a) a first enclosure portion including an upper endwall and a peripheral sidewall having a remote end, (b) a second enclosure portion including an interior flange disposed in axially spaced recessed relation from said first enclosure portion remote end inwardly of the peripheral sidewall, (c) first attachment means attaching the second enclosure portion to the first enclosure portion, (d) second attachment means attaching the loudspeaker flange to the interior flange whereby the loudspeaker is recessed within the ceiling, and (e) third attachment means operatively attaching the first and second enclosure portions to the ceiling.

2. A mounting assembly as defined in claim 1, in which:

(f) the second enclosure portion includes an exterior flange and a peripheral sidewall interconnecting said exterior flange to said interior flange.

3. A mounting assembly as defined in claim 2 in which:

(g) said peripheral sidewall of one of said enclosure portions includes a conical portion to facilitate interfitting said second enclosure portion into said first enclosure portion.

4. A loudspeaker mounting assembly for a loudspeaker having a mounting flange, the assembly being adapted to recess mount the loudspeaker to a ceiling having an upper side and a lower side, the assembly comprising:

(a) a first enclosure portion including an upper endwall and a peripheral sidewall having a remote end, (b) a second enclosure portion including an interior flange disposed in axially spaced recessed relation from said first enclosure portion remote end inwardly of the peripheral sidewall, (c) first attachment means attaching the second enclosure portion to the first enclosure portion, (d) second attachment means attaching the loudspeaker flange to the interior flange whereby the loudspeaker is recessed within the ceiling, and (e) third attachment means operatively attaching the first and second enclosure portions to the ceiling, (h) said peripheral sidewall of said second enclosure portion including a lower portion sized for a close interfit within said peripheral sidewall of said first enclosure portion and said first attachment means including a plurality of circumferentially disposed spot welds between said interfitting sidewall portions.

5. A mounting assembly as defined in claim 1, in which:

(f) said loudspeaker flange and said interior flange are operatively interconnected by threaded fasteners with the loudspeaker flange disposed below the interior flange.

6. A loudspeaker mounting assembly for a loudspeaker having a mounting flange, the assembly being adapted recess to mount the loudspeaker to a ceiling having an upper side and a lower side, the assembly comprising:

(a) a first enclosure portion including an upper endwall and a peripheral sidewall having a remote end, (b) a second enclosure portion including an interior flange disposed in axially spaced recessed relation from said first enclosure portion remote end inwardly of the peripheral sidewall, (c) first attachment means attaching the second enclosure portion to the first enclosure portion, (d) second attachment means attaching the loudspeaker flange to the interior flange whereby the loudspeaker is recessed within the ceiling, and (e) third attachment means operatively attaching the first and second enclosure portions to the ceiling, (f) the second enclosure including an exterior flange and a peripheral sidewall interconnecting said exterior flange to said interior flange, and (g) said third attachment means being a plurality of attachment means each including an apertured member fixedly attached to said first enclosure portion peripheral sidewall, a threaded fastener received by said exterior flange and a clamping member adapted for vertical movement on said threaded fastener to clamp said enclosure first and second portions to said ceiling.

7. A mounting assembly as defined in claim 1, in which:

(f) said assembly includes a baffle and attachment means attaching said baffle to second enclosure portion.

8. A mounting assembly as defined in claim 2, in which:

(g) said assembly includes a baffle and attachment means attaching said baffle to said second enclosure portion and said baffle attachment means includes a plurality of serrated studs fixedly attached to said baffle and a plurality of cooperating clips fixedly attached to said second enclosure portion exterior flange.

9. A loudspeaker mounting assembly for a loudspeaker having a mounting flange, the assembly being adapted recess to mount the loudspeaker to a ceiling having an upper side and a lower side, the assembly comprising:

(a) a first enclosure portion including an upper endwall and a peripheral sidewall having a remote end, (b) a second enclosure portion including an interior flange disposed in axially spaced recessed relation from said first enclosure portion remote end inwardly of the peripheral sidewall, (c) first attachment means attaching the second enclosure portion to the first enclosure portion, (d) second attachment means attaching the loudspeaker flange to the interior flange whereby the loudspeaker is recessed within the ceiling, and (e) third attachment means operatively attaching the first and second enclosure portions to the ceiling, and (f) said assembly including an apertured frame carried by and reinforcing said ceiling and receiving said first enclosure portion therethrough and said third engagement means including clamping members engaging said frame.

10. A loudspeaker mounting assembly for a loudspeaker having a mounting flange, the assembly being adapted to recess mount the loudspeaker to a surface having an inner side and an outer side, the assembly comprising:

(a) a first enclosure portion including an endwall and a peripheral sidewall having a remote end, (b) a second enclosure portion including an outer exterior flange and an inner interior flange and a peripheral sidewall connecting said exterior and interior flanges and disposed within the peripheral sidewall of the first enclosure portion, the inner interior flange being axially spaced in recessed relation from said first enclosure portion remote end, (c) first attachment means attaching the sidewalls of the first and second enclosure portions in fixed relation, (d) second attachment means attaching the loudspeaker flange to the second enclosure portion interior flange, (e) third attachment means for attaching the first and second enclosure portions to the surface, and (f) a baffle disposed outwardly of the ceiling including means attaching said baffle to said second enclosure portion exterior flange.

11. An assembly as defined in claim 10, in which:

(g) the first enclosure portion endwall, and the sidewall disposed above the interior flange defines a volume sized to suit the loudspeaker mounted to said flange to optimize the loudspeaker performance.

12. An assembly as defined in claim 10, in which:

(g) the first enclosure portion above the interior flange is at least in part coated with a pliable mastic coating to seal the interior thereof and deaden resonance.

13. An assembly as defined in claim 12, in which:

(h) the first enclosure portion endwall has an inner face and a soundboard bonded to the inner face to reduce diaphragmatic movement.

14. An assembly as defined in claim 13, in which:

(i) the first enclosure portion sidewall above the mounting flange is lined with a wrap material to absorb standing waves.

15. A loudspeaker mounting assembly for a loudspeaker having a mounting flange, the assembly being adapted to recess mount the loudspeaker to a surface having an inner side and an outer side, the assembly comprising:

(a) an enclosure portion including an outer exterior flange and an inner interior flange and a peripheral sidewall connecting said exterior and interior flanges, the inner interior flange being axially spaced in recessed relation from said outer exterior flange by said peripheral sidewall, (b) attachment means removably attaching the loudspeaker flange to the enclosure portion interior flange whereby the loud speaker is recessed behind the surface to which the assembly is mounted, (c) attachment means attaching the enclosure portion exterior flange to the surface.

16. A mounting assembly as defined in claim 15, in which:

(d) a baffle is disposed outwardly of the surface, including fastener means removably attaching said baffle to said enclosure portion exterior flange.

17. A loudspeaker mounting assembly for a loudspeaker having a mounting flange, the assembly being adapted to recess mount the loudspeaker to a ceiling having an upper side and a lower side, the assembly comprising:

(a) an enclosure including a peripheral sidewall, an endwall, an outer exterior flange and an inner interior flange the inner interior flange being disposed between the endwall and the exterior flange in axially spaced recessed relation from said outer exterior flange, (b) fastener means removably attaching the loudspeaker flange to the interior flange below the interior flange whereby the loudspeaker is recessed above the ceiling lower side, (c) fastener means attaching the exterior flange to the ceiling without requiring access above the ceiling, (d) a baffle disposed below the ceiling lower side, and (e) fastener means removably attaching said baffle to said exterior flange.

* * * * *